United States Patent
Tseng et al.

(10) Patent No.: US 12,063,791 B2
(45) Date of Patent: Aug. 13, 2024

(54) LAYOUT PATTERN OF MAGNETORESISTIVE RANDOM ACCESS MEMORY

(71) Applicant: UNITED MICROELECTRONICS CORP., Hsin-Chu (TW)

(72) Inventors: Chun-Yen Tseng, Tainan (TW); Shu-Ru Wang, Taichung (TW); Yu-Tse Kuo, Tainan (TW); Chang-Hung Chen, Tainan (TW); Yi-Ting Wu, Tainan (TW); Shu-Wei Yeh, Taichung (TW); Ya-Lan Chiou, Tainan (TW); Chun-Hsien Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/952,327

(22) Filed: Sep. 26, 2022

(65) Prior Publication Data
US 2023/0018513 A1    Jan. 19, 2023

Related U.S. Application Data

(62) Division of application No. 17/006,928, filed on Aug. 31, 2020, now Pat. No. 11,489,010.

(30) Foreign Application Priority Data
Aug. 4, 2020    (CN) .......................... 202010770916.0

(51) Int. Cl.
*H10B 61/00*    (2023.01)
*H10N 50/80*    (2023.01)

(52) U.S. Cl.
CPC .............. *H10B 61/22* (2023.02); *H10N 50/80* (2023.02)

(58) Field of Classification Search
CPC ......... H10B 61/22; H10B 61/00; H10N 50/80
See application file for complete search history.

(56) References Cited

U.S. PATENT DOCUMENTS

| 7,133,310 | B2 | 11/2006 | Hidaka |
| 8,164,147 | B2 | 4/2012 | Asao |
| 2008/0203503 | A1* | 8/2008 | Asao ...................... H10B 61/22 |
| | | | 257/E29.323 |
| 2011/0180861 | A1 | 7/2011 | Iwayama |

* cited by examiner

*Primary Examiner* — Shih Tsun A Chou
(74) *Attorney, Agent, or Firm* — Winston Hsu

(57) ABSTRACT

A layout pattern of a magnetoresistive random access memory (MRAM) includes a substrate having a first cell region and a second cell region and a diffusion region on the substrate extending through the first cell region and the second cell region. Preferably, the diffusion region includes a first H-shape and a second H-shape according to a top view.

10 Claims, 10 Drawing Sheets

LAYOUT PATTERN OF MAGNETORESISTIVE RANDOM ACCESS MEMORY

CROSS REFERENCE TO RELATED APPLICATIONS

This application is a division of U.S. application Ser. No. 17/006,928, filed on Aug. 31, 2020. The content of the application is incorporated herein by reference.

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a layout pattern of a magnetoresistive random access memory (MRAM) includes a substrate having a first cell region and a second cell region and a diffusion region on the substrate extending through the first cell region and the second cell region. Preferably, the diffusion region includes a first H-shape and a second H-shape according to a top view.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
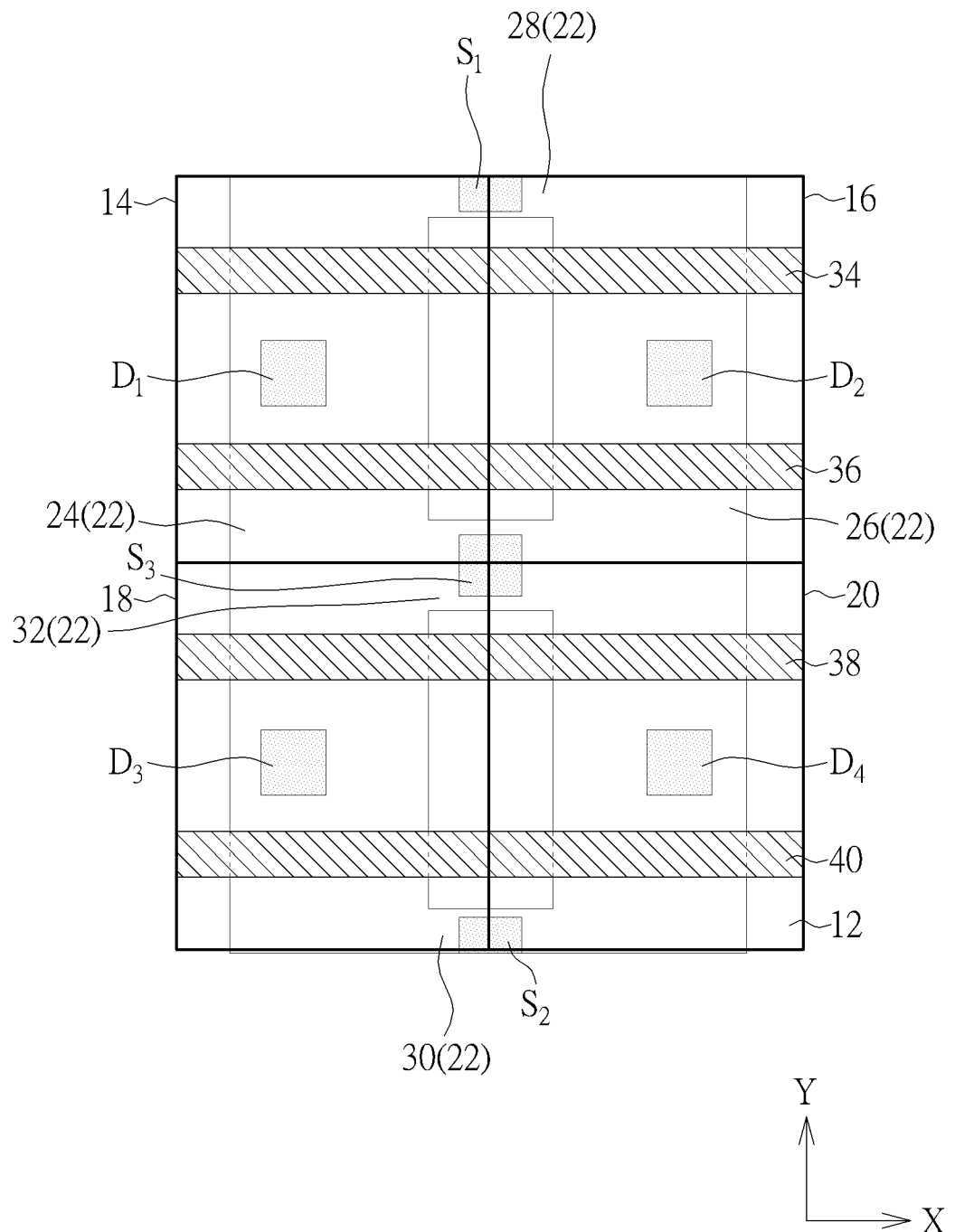
FIGS. 1-5 illustrate a layout pattern of a MRAM device according to an embodiment of the present invention.

Referring to FIGS. 1-5, FIGS. 1-5 illustrate a layout pattern of a MRAM device with elements in different levels according to an embodiment of the present invention. As shown in FIG. 1, a substrate 12 made of semiconductor material is provided, in which the substrate 12 could be selected from the group consisting of silicon (Si), germanium (Ge), Si—Ge compounds, silicon carbide (SiC), and gallium arsenide (GaAs). Next, a first cell region 14, a second cell region 16, a third cell region 18, and a fourth cell region 20 are defined on the substrate 12, in which each of the cell region or memory cell region preferably includes two sets of transistors and a MTJ for constituting a 2T1MTJ cell structure.

The substrate 12 preferably includes a diffusion region 22 extending through the first cell region 14, the second cell region 16, the third cell region 18, and the fourth cell region 20, in which the diffusion region 22 includes a H-shape according to a top view perspective. Specifically, the diffusion region 22 further includes a first portion 24 extending from the first cell region 14 to the third cell region 18 along a first direction (such as Y-direction), a second portion 26 extending from the second cell region 16 to the fourth cell region 20 along the first direction, a third portion 28 extending from the first cell region 14 to the second cell region 16 along a second direction (X-direction) for connecting the first portion 24 and the second portion 26, a fourth portion 30 extending from the third cell region 18 to the fourth cell region 20 along the second direction for connecting the first portion 24 and the second portion 26, and a fifth portion 32 extending between the third portion 28 and the fourth portion 30 along the second direction for connecting the first portion 24 and the second portion 26.

Viewing from an overall perspective the third portion 28, the fourth portion 30, and the fifth portion 32 are all disposed extending along the X-direction and parallel to each other, and the fifth portion 32 is disposed between the third portion 28 and the fourth portion 30 while overlapping the first cell region 14, the second cell region 16, the third cell region 18, and the fourth cell region 20.

A plurality of gate patterns or word lines (WLs) including a first gate pattern 34, a second gate pattern 36, a third gate pattern 38, and a fourth pattern 40 are disposed on the diffusion region 22, in which the first gate pattern 34 is extending from the first cell region 14 to the second cell region 16 along the second direction, the second gate pattern 36 is extending from the first cell region 14 to the second cell region 16 along the second direction, the third gate pattern 38 is extending from the third cell region 18 to the fourth cell region 20 along the second direction, and the fourth gate pattern 40 is extending from the third cell region 18 to the fourth cell region 20 along the second direction.

The MRAM device further includes a first source region $S_1$ disposed on the third portion 28, a second source region $S_2$ disposed on the fourth portion 30, a third source region $S_3$ disposed on the fifth portion 32, a first drain region $D_1$ disposed on the first cell region 14 between the first gate pattern 34 and the second gate pattern 36, a second drain region $D_2$ disposed on the second cell region 16 between the first gate pattern 34 and the second gate pattern 36, a third drain region $D_3$ disposed on the third cell region 18 between the third gate pattern 38 and the fourth gate pattern 40, and a fourth drain region $D_4$ disposed on the fourth cell region 20 between the third gate pattern 38 and the fourth gate pattern 40. It should be noted that a contact plug (not shown) having rectangular profile is disposed on each of the first source region $S_1$, second source region $S_2$, third source region $S_3$, first drain region $D_1$, second drain region $D_2$, third drain region $D_3$, and fourth drain region $D_4$ for connecting the source and drain regions to the first level metal patterns formed afterwards while the source and drain regions are essentially disposed adjacent to two sides of the gate patterns and not limited in the rectangular blocks.

Figure 2:
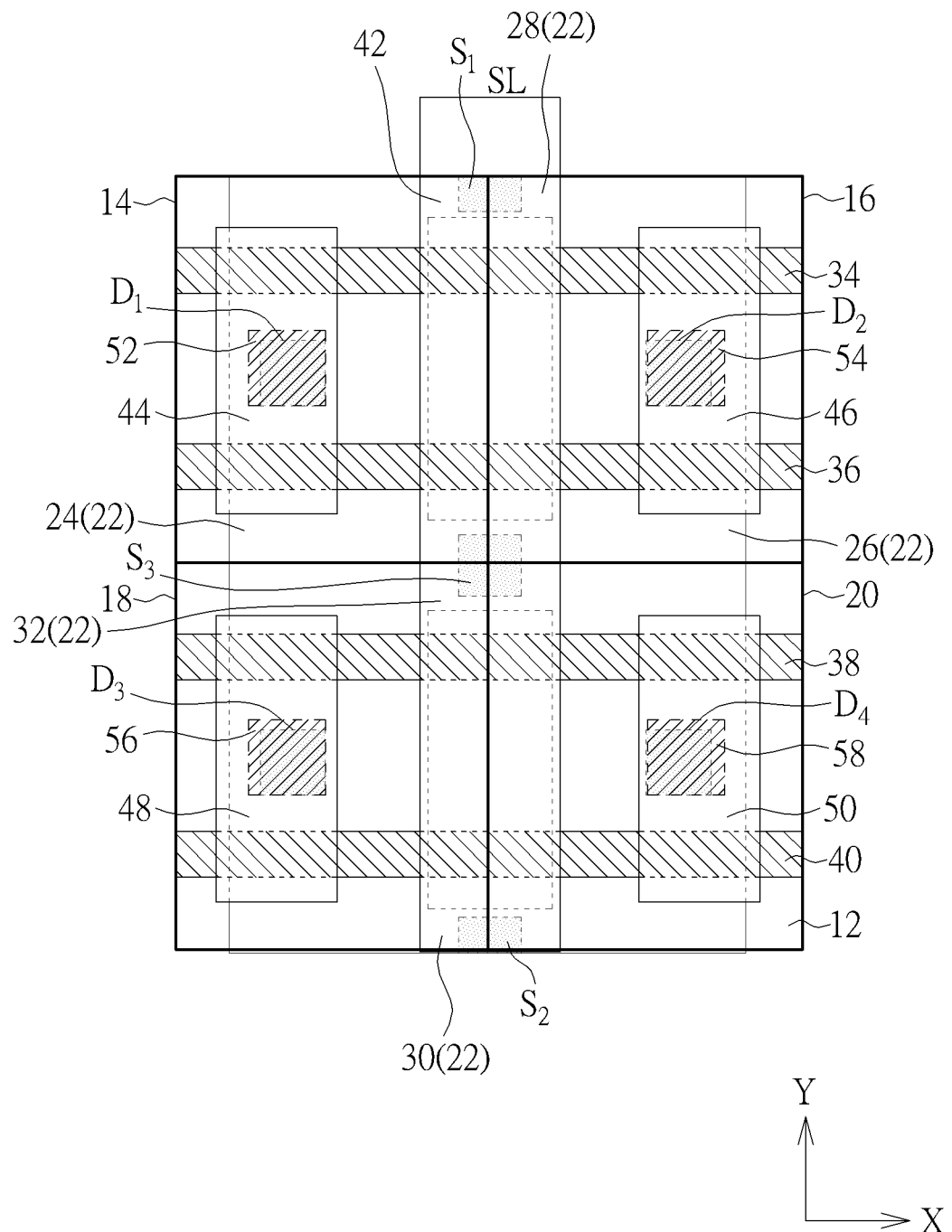

As shown in FIG. 2, the MRAM device further includes a plurality of first level metal patterns M1 disposed on the first cell region 14, the second cell region 16, the third cell region 18, and the fourth cell region 20 while overlapping each of the gate patterns, in which the first level metal patterns include a first metal pattern 42 extending along the first direction such as Y-direction overlapping and connecting the first source region $S_1$, the second source region $S_2$, and the third source region $S_3$, a second metal pattern 44 extending along the first direction overlapping and connecting the first drain region $D_1$, a third metal pattern 46 extending along the first direction overlapping and connecting the second drain region $D_2$, a fourth metal pattern 48 extending along the first direction overlapping and connecting the third drain region $D_3$, and a fifth metal pattern 50 extending along the first direction overlapping and connecting the fourth drain region $D_4$.

Viewing from a top view perspective, each of the first metal pattern 42, second metal pattern 44, third metal pattern 46, fourth metal pattern 48, and fifth metal pattern 50 include a rectangular shape extending along the Y-direction and overlapping the source regions and drain regions in the cell regions. It should be noted that the first metal pattern 42 from the first level metal patterns is coupled to or directly connecting to a source line (SL) so that signals could be transmitted on the same level.

MRAM device also includes a plurality of first level via patterns (also referred to as V1) disposed on the first level metal patterns on the first cell region 14, second cell region 16, third cell region 18, and fourth cell region 20, in which the first level via patterns include a via pattern 52 disposed on the second metal pattern 44, a via pattern 54 disposed on the third metal pattern 46, a via pattern 56 disposed on the fourth metal pattern 48, and a via pattern 58 disposed on the fifth metal pattern 50.

Figure 3:
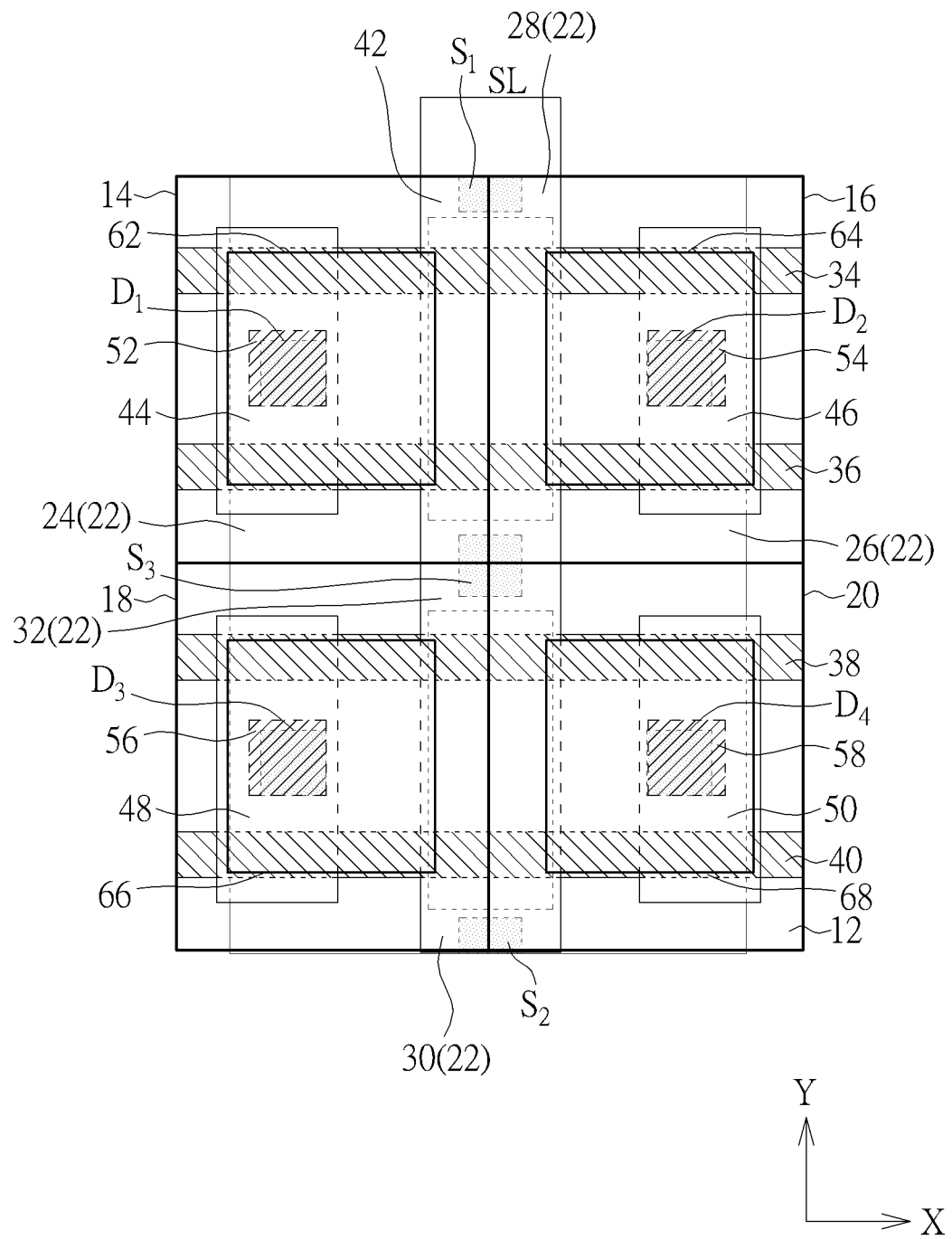

Next, as shown in FIG. 3, the MRAM device further includes a plurality of second level metal patterns M2 disposed on and overlapping each of the first level metal patterns and first level via patterns on the first cell region 14, second cell region 16, third cell region 18, and fourth cell region 20, in which the second level metal patterns includes a metal pattern 62 overlapping the second metal pattern 44 on the first cell region 14, a metal pattern 64 overlapping the third metal pattern 46 on the second cell region 16, a metal pattern 66 overlapping the fourth metal pattern 48 on the third cell region 18, and a metal pattern 68 overlapping the fifth metal pattern 50 on the fourth cell region 20. Viewing from a top view perspective, each of the metal patterns from the second level metal patterns include a substantially square shape overlapping the drain regions disposed on each of the cell regions.

Figure 4:
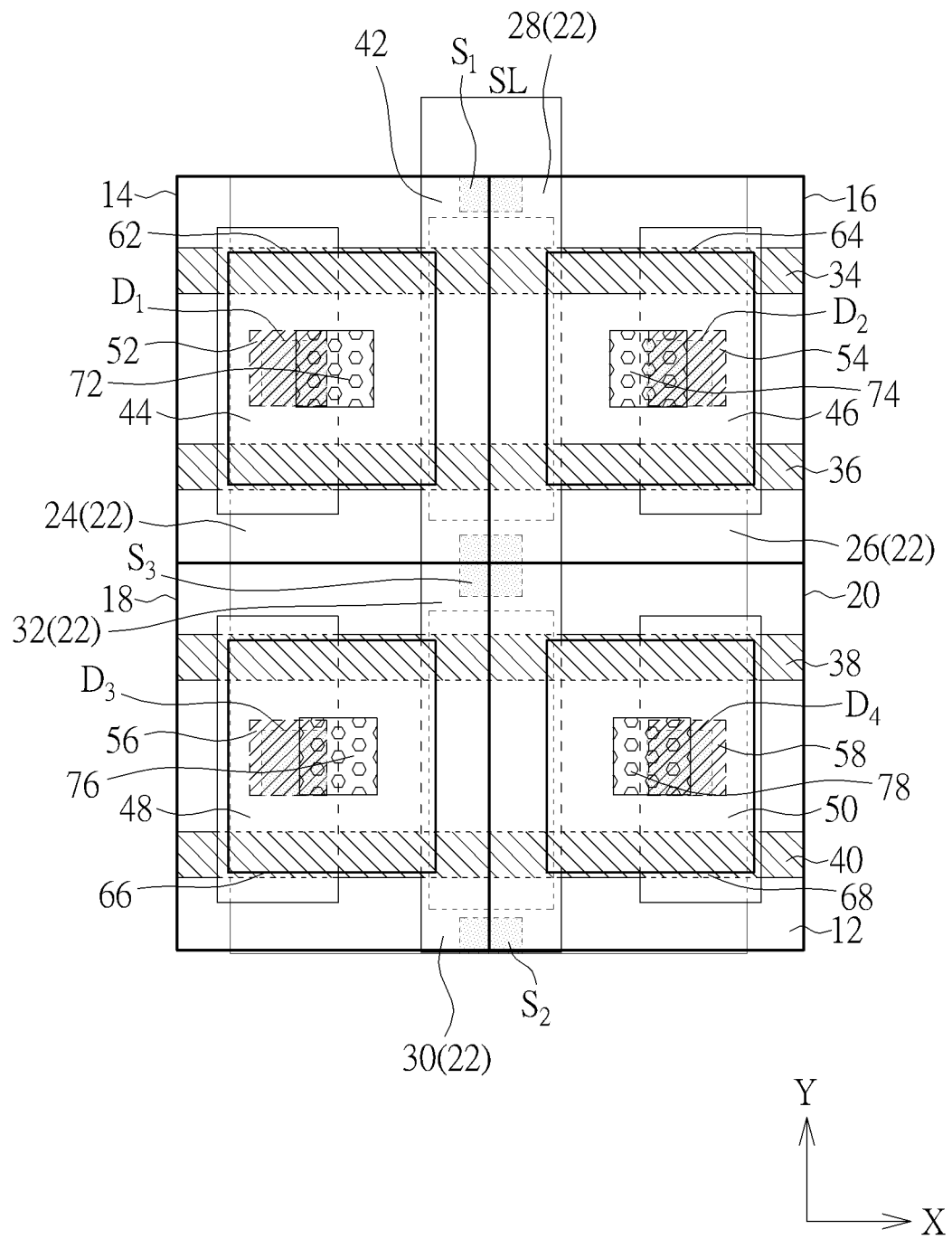

Next, as shown in FIG. 4, the MRAM device includes a plurality of MTJs disposed on the second level metal patterns and coupled to the lower level second level metal interconnections and even lower level drain regions, in which the MTJs include a first MTJ 72 disposed on the metal pattern 62 on the first cell region 14 and connected to the first drain region $D_1$, a second MTJ 74 disposed on the metal pattern 64 on the second cell region 16 and connected to the second drain region $D_2$, a third MTJ 76 disposed on the metal pattern 66 on the third cell region 18 and connected to the third drain region $D_3$, and a fourth MTJ 78 disposed on the metal pattern 68 on the fourth cell region 20 and connected to the fourth drain region $D_4$. Since the MTJs are disposed on the second level metal patterns, the MTJs could be understood as third level metal patterns M3.

In this embodiment, each of the MTJs preferably includes a bottom electrode, a pinned layer, a barrier layer, a free layer, and a top electrode disposed on the second level metal patterns. Preferably, the bottom electrode layer and the top electrode layer are made of conductive material including but not limited to for example Ta, Pt, Cu, Au, Al, or combination thereof. The pinned layer could be made of ferromagnetic material including but not limited to for example iron, cobalt, nickel, or alloys thereof such as cobalt-iron-boron (CoFeB) or cobalt-iron (CoFe). Moreover, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

Overall, each of the cell regions includes a 2T1MTJ cell structure that preferably includes two transistors accompanying a single MTJ. For instance, a first source region $S_1$, a first gate pattern 34, a first drain region $D_1$, a second gate pattern 36, a third source region $D_3$, and a first MTJ 72 disposed on the first cell region 14 preferably constitute a 2T1MTJ cell structure in the first cell region 14.

Figure 5:
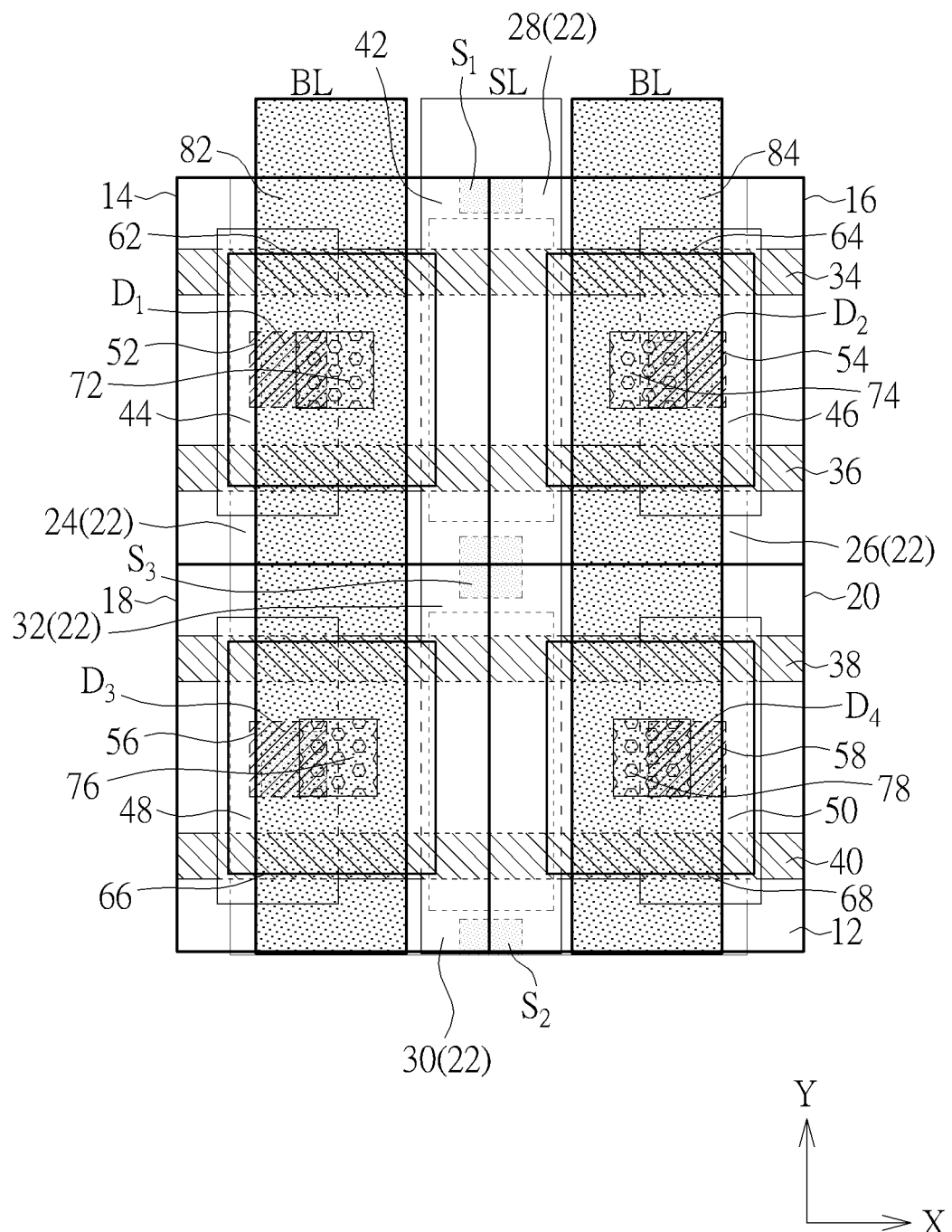

Next, as shown in FIG. 5, the MRAM device includes a plurality of fourth level metal patterns M4 disposed on the first cell region 14, second cell region 16, third cell region 18, and fourth cell region 20 to overlap the MTJs, in which the fourth level metal patterns include a metal pattern 82 extending from the first cell region 14 to the third cell region 18 along the first direction such as Y-direction to overlap the first MTJ 72 and the third MTJ 76 and a metal pattern 84 extending from the second cell region 16 to the fourth cell region 20 along the same first direction to overlap the second MTJ 74 and the fourth MTJ 78.

Viewing from a top view perspective, each of the metal patterns from the fourth level metal patterns include rectangular shape extending along the Y-direction and overlapping the drain region and MTJ disposed in each cell region. It should also be noted that each of the metal patterns 82, 84 from the fourth level metal patterns are also coupled to or directly connected to a bit line (BL) for passing the signals.

Figure 6:
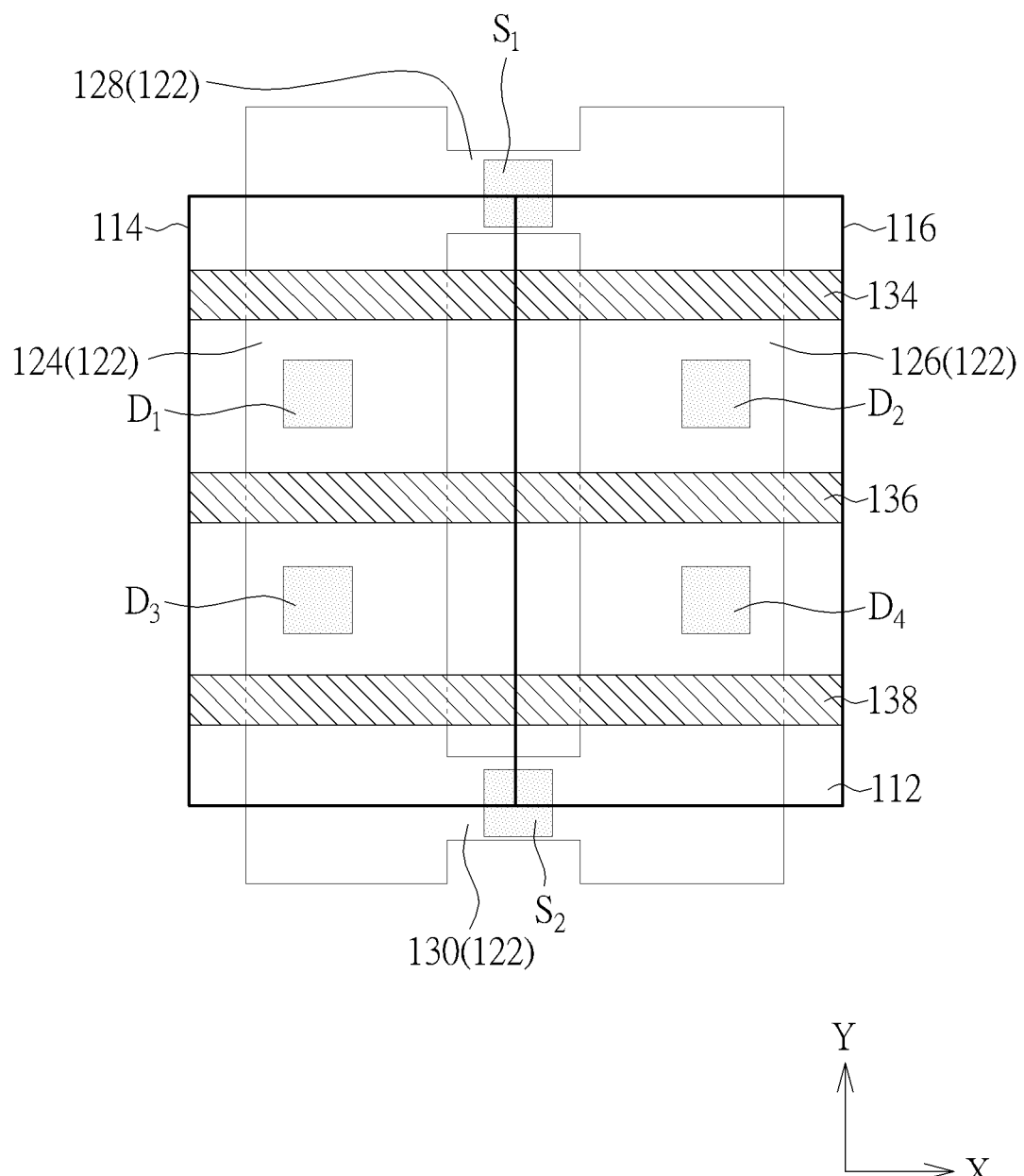
FIGS. 6-10 illustrate a layout pattern of a MRAM device according to an embodiment of the present invention.

Referring to FIGS. 6-10, FIGS. 6-10 illustrate a layout pattern of a MRAM device according to an embodiment of the present invention. For simplicity purpose, elements from the aforementioned embodiments are labeled with same numberings. As shown in FIG. 6, a substrate 112 made of semiconductor material is provided, in which the substrate 112 could be selected from the group consisting of silicon (Si), germanium (Ge), Si—Ge compounds, silicon carbide (SiC), and gallium arsenide (GaAs). Next, a first cell region 114 and a second cell region 116 are defined on the substrate 112, in which each of the cell region or memory cell region preferably includes three sets of transistors and two MTJs for constituting a 3T2MTJ cell structure.

The substrate 112 preferably includes a diffusion region 122 extending through the first cell region 114 and the second cell region 116, in which the diffusion region 122 includes a first H-shape and a second H-shape according to a top view perspective. Specifically, the diffusion region 122 further includes a first portion 124 extending in the first cell region 114 along a first direction (such as Y-direction), a second portion 126 extending in the second cell region 116 along the first direction, a third portion 128 extending from the first cell region 114 to the second cell region 116 along a second direction (X-direction) for connecting the first portion 124 and the second portion 126, and a fourth portion 130 extending from the first cell region 114 to the second cell region 116 along the second direction for connecting the first portion 124 and the second portion 126.

It should be noted that viewing from a top view perspective, the third portion 128 and the fourth portion 130 preferably overlaps the boundaries of the first cell region 114 and second cell region 116 and part of the first portion 124, second portion 126, third portion 128, and fourth portion 130 exceed the boundaries of the first cell region 114 and second cell region 116. Nevertheless, according to other embodiment of the present invention it would also be desirable to contain all the outer boundary of the first portion 124, second portion 126, third portion 128, and fourth portion 130 within the first cell region 114 and second cell region 116 so that all the four portions of the diffusion region 122 do not cross over the boundaries of the two cell regions, which is also within the scope of the present invention.

The MRAM device further includes a plurality of gate patterns such as a first gate pattern 134, a second gate pattern 136, and a third gate pattern 138 disposed on the diffusion region 22, in which the first gate pattern 134 is extending from the first cell region 114 to the second cell region 116 along the second direction, the second gate pattern 136 is extending from the first cell region 114 to the second cell region 116 along the second direction, and the third gate pattern 138 is extending from the first cell region 114 to the second cell region 116 along the second direction.

The MRAM device further includes a first source region $S_1$ disposed on the third portion 128, a second source region $S_2$ disposed on the fourth portion 130, a first drain region $D_1$ disposed on the first cell region 114 between the first gate pattern 134 and the second gate pattern 136, a second drain region $D_2$ disposed on the second cell region 116 between the first gate pattern 134 and the second gate pattern 136, a third drain region $D_3$ disposed on the first cell region 114 between the second gate pattern 136 and the third gate pattern 138, and a fourth drain region $D_4$ disposed on the second cell region 116 between the second gate pattern 136 and the third gate pattern 138. Similar to the aforementioned embodiment, a contact plug (not labeled) having rectangular shape is disposed on each of the first source region $S_1$, second source region $S_2$, first drain region $D_1$, second drain region $D_2$, third drain region $D_3$, and fourth drain region $D_4$ for connecting the source and drain regions to the first level metal patterns formed afterwards while the source and drain regions are essentially disposed adjacent to two sides of the gate patterns and not limited in the rectangular blocks.

Figure 7:
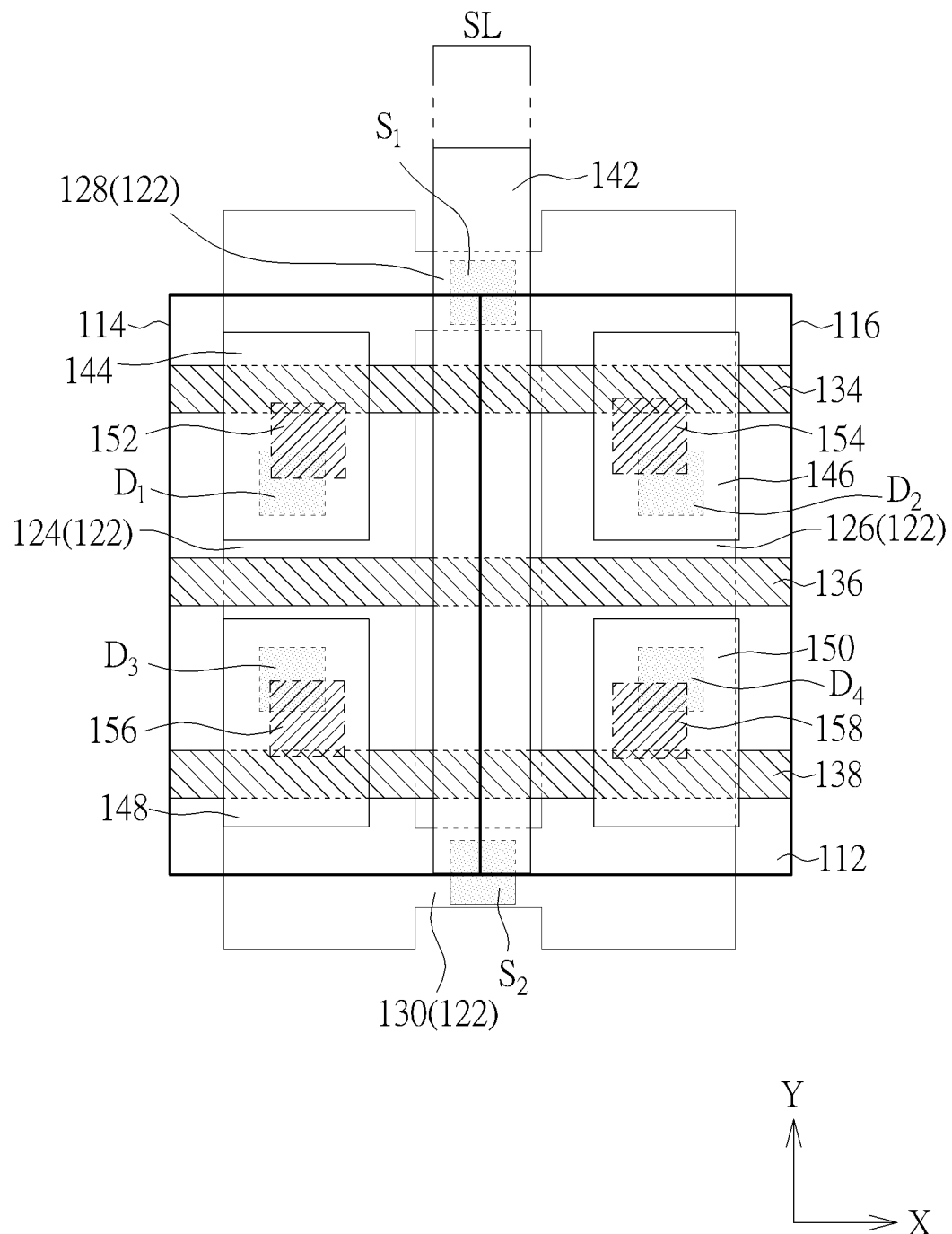

As shown in FIG. 7, the MRAM device further includes a plurality of first level metal patterns M1 disposed on the first cell region 114 and the second cell region 116 while overlapping each of the gate patterns, in which the first level metal patterns include a first metal pattern 142 extending along the first direction such as Y-direction overlapping and connecting the first source region $S_1$ and the second source region $S_2$, a second metal pattern 144 extending along the first direction overlapping and connecting the first drain region $D_1$, a third metal pattern 146 extending along the first direction overlapping and connecting the second drain region $D_2$, a fourth metal pattern 148 extending along the first direction overlapping and connecting the third drain region $D_3$, and a fifth metal pattern 150 extending along the first direction overlapping and connecting the fourth drain region $D_4$.

Viewing from a top view perspective, each of the first metal pattern 142, second metal pattern 144, third metal pattern 146, fourth metal pattern 148, and fifth metal pattern 150 include a rectangular shape extending along the Y-direction and overlapping the source regions and drain regions in the cell regions. Similar to the aforementioned embodiment, the first metal pattern 142 from the first level metal patterns is coupled to or directly connecting to a source line (SL) so that signals could be transmitted on the same level.

MRAM device also includes a plurality of first level via patterns (also referred to as V1) disposed on the first level metal patterns on the first cell region 114 and second cell region 116, in which the first level via patterns include a via pattern 152 disposed on the second metal pattern 144, a via pattern 154 disposed on the third metal pattern 146, a via pattern 156 disposed on the fourth metal pattern 148, and a via pattern 158 disposed on the fifth metal pattern 150.

Figure 8:
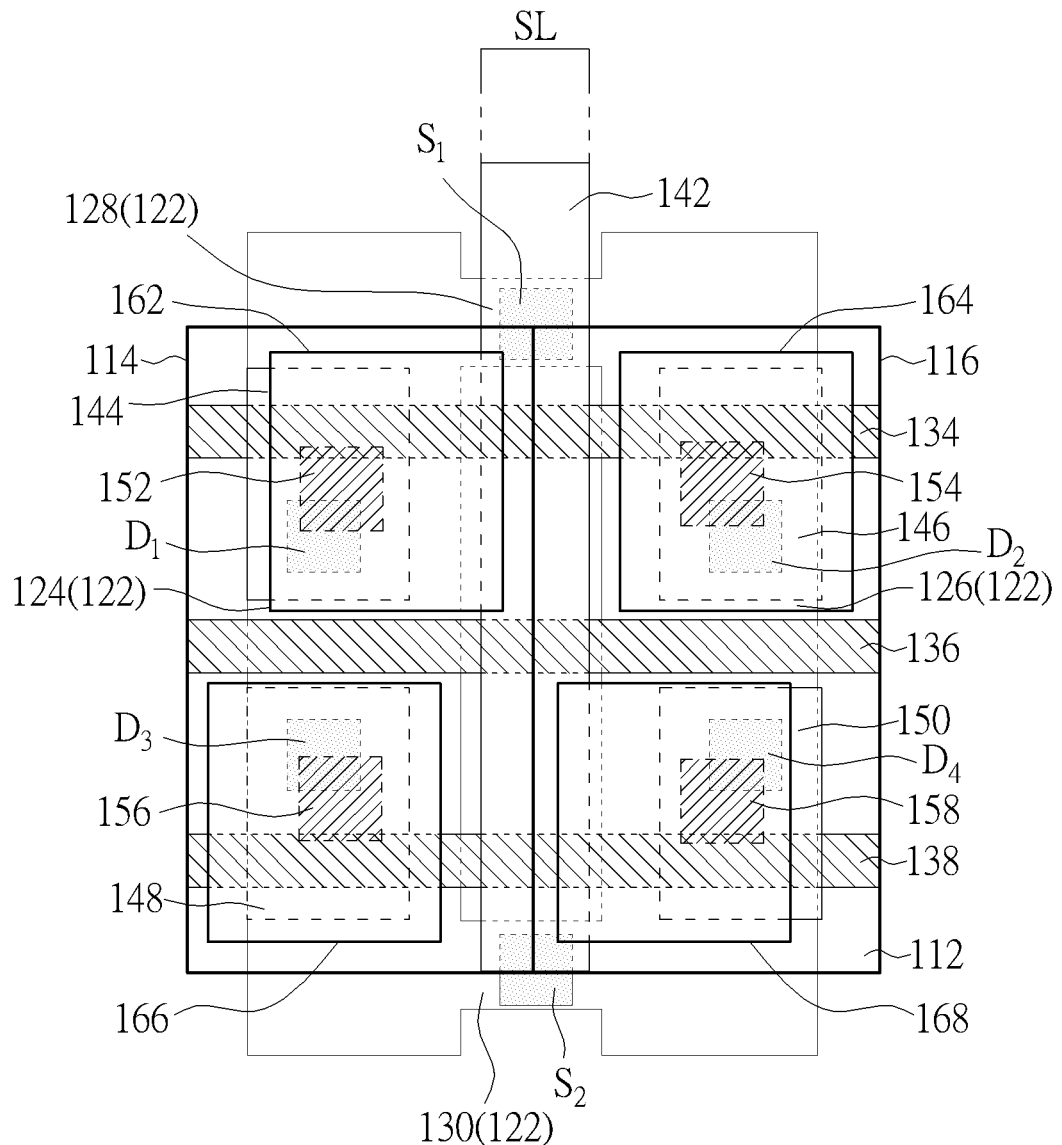

Next, as shown in FIG. 8, the MRAM device further includes a plurality of second level metal patterns M2 disposed on and overlapping each of the first level metal patterns and first level via patterns on the first cell region 114 and second cell region 116, in which the second level metal patterns includes a metal pattern 162 overlapping the second metal pattern 144 on the first cell region 114, a metal pattern 164 overlapping the third metal pattern 146 on the second cell region 116, a metal pattern 166 overlapping the fourth metal pattern 148 on the first cell region 114, and a metal pattern 168 overlapping the fifth metal pattern 150 on the second cell region 116. Viewing from a top view perspective, each of the metal patterns from the second level metal patterns include a substantially square shape overlapping the drain regions disposed on each of the cell regions.

Figure 9:
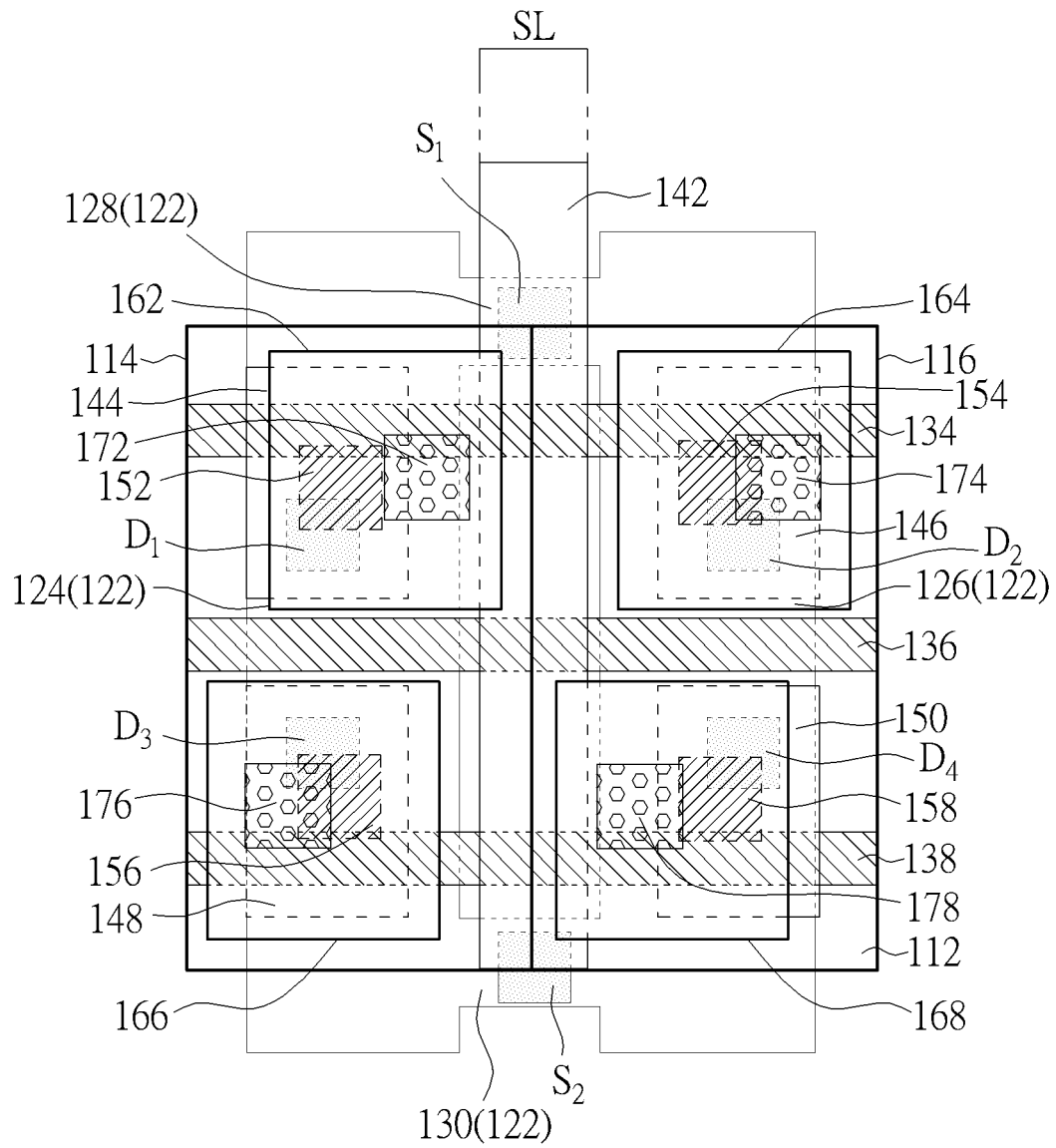

Next, as shown in FIG. 9, the MRAM device includes a plurality of MTJs disposed on the second level metal patterns and coupled to the lower level second level metal patterns and even lower level drain regions, in which the MTJs include a first MTJ 172 disposed on the metal pattern 162 on the first cell region 114 and connected to the first drain region $D_1$, a second MTJ 174 disposed on the metal pattern 164 on the second cell region 116 and connected to the second drain region D$_2$, a third MTJ 176 disposed on the metal pattern 166 on the first cell region 114 and connected to the third drain region D$_3$, and a fourth MTJ 178 disposed on the metal pattern 168 on the second cell region 116 and connected to the fourth drain region D$_4$. Similar to the aforementioned embodiment, each of the MTJs preferably includes a bottom electrode, a pinned layer, a barrier layer, a free layer, and a top electrode disposed on the second level metal patterns.

Overall, each of the cell regions includes a 3T2MTJ cell structure that preferably includes three transistors accompanying two MTJs. For instance, a first source region S$_1$, a first gate pattern 134, a first drain region D$_1$, a second gate pattern 136, a third drain region D$_3$, a third gate pattern 138, a second source region S$_2$, a first MTJ 172, and a third MTJ 176 disposed on the first cell region 114 preferably constitute a 3T2MTJ cell structure in the first cell region 114.

Figure 10:
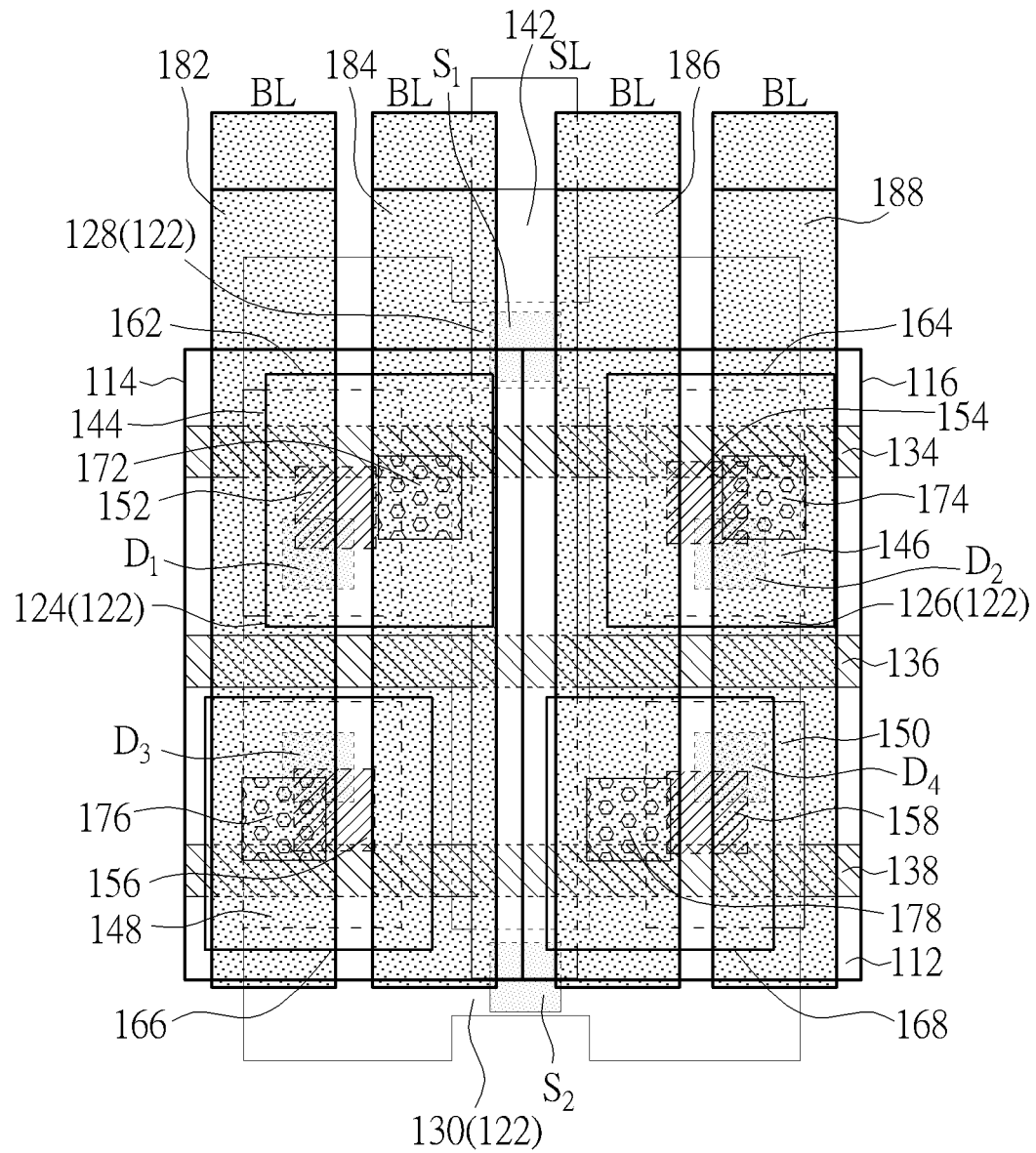

Next, as shown in FIG. 10, the MRAM device includes a plurality of fourth level metal patterns M4 disposed on the first cell region 114 and second cell region 116 to overlap the MTJs, in which the fourth level metal patterns include metal patterns 182, 184 extending along the first direction such as Y-direction in the first cell region 114 to overlap the first MTJ 172 and the third MTJ 176 and metal patterns 186, 188 extending along the same first direction in the second cell region 116 to overlap the second MTJ 174 and the fourth MTJ 178.

Viewing from a top view perspective, each of the metal patterns from the fourth level metal patterns include rectangular shape extending along the Y-direction and overlapping the drain region and MTJ disposed in each cell region. It should also be noted that each of the metal patterns from the fourth level metal patterns is also coupled to or directly connected to a bit line (BL) for passing the signals.

Overall, in contrast to using the second level metal patterns to couple to source line (SL) for transmitting signals in conventional MRAM device, the present invention preferably adjusts the layout of the diffusion region and first level metal patterns so that the first level metal patterns could be coupled to the source line SL directly. By using this design it would be desirable to save significantly more space in the memory cell regions and also adjust the position of the MTJs to prevent misalignment between MTJs and metal interconnections underneath.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a magnetoresistive random access memory (MRAM), comprising:
   a substrate having a first cell region and a second cell region; and
   a diffusion region on the substrate extending through the first cell region and the second cell region, wherein the diffusion region comprises a first H-shape and a second H-shape and the first H-shape and the second H-shape comprise two horizontal portions connected between two vertical portions.

2. The layout pattern of a MRAM of claim 1, wherein the diffusion region comprises:
   a first portion extending in the first cell region along a first direction on the substrate;
   a second portion extending in the second cell region along the first direction on the substrate;
   a third portion extending from the first cell region to the second cell region along a second direction for connecting the first portion and the second portion; and
   a fourth portion extending from the first cell region to the second cell region along the second direction for connecting the first portion and the second portion.

3. The layout pattern of a MRAM of claim 2, wherein the first portion overlaps a boundary between the first cell region and the second cell region.

4. The layout pattern of a MRAM of claim 2, further comprising:
   a first gate pattern extending from the first cell region to the second cell region along the second direction;
   a second gate pattern extending from the first cell region to the second cell region along the second direction; and
   a third gate pattern extending from the first cell region to the second cell region along the second direction.

5. The layout pattern of a MRAM of claim 4, further comprising:
   a first source region on the third portion; and
   a second source region on the fourth portion.

6. The layout pattern of a MRAM of claim 5, further comprising:
   a first metal pattern extending along the first direction overlapping and connecting the first source region and the second source region.

7. The layout pattern of a MRAM of claim 6, where the first metal pattern is connected to a source line.

8. The layout pattern of a MRAM of claim 5, further comprising:
   a first drain region on the first cell region between the first gate pattern and the second gate pattern;
   a second drain region on the second cell region between the first gate pattern and the second gate pattern;
   a third drain region on the first cell region between the second gate pattern and the third gate pattern; and
   a fourth drain region on the second cell region between the second gate pattern and the third gate pattern.

9. The layout pattern of a MRAM of claim 8, further comprising:
   a second metal pattern extending along the first direction overlapping and connecting the first drain region;
   a third metal pattern extending along the first direction overlapping and connecting the second drain region;
   a fourth metal pattern extending along the first direction overlapping and connecting the third drain region; and
   a fifth metal pattern extending along the first direction overlapping and connecting the fourth drain region.

10. The layout pattern of a MRAM of claim 8, further comprising:
    a first magnetic tunneling junction (MTJ) connecting the first drain region;
    a second MTJ connecting the second drain region;
    a third MTJ connecting the third drain region; and
    a fourth MTJ connecting the fourth drain region.

* * * * *